United States Patent
Lin et al.

(10) Patent No.: US 12,234,396 B2
(45) Date of Patent: Feb. 25, 2025

(54) OPTICAL ADHESIVE FILM STRUCTURE, STITCHING DISPLAY MODULE AND MANUFACTURING METHOD THEREOF

(71) Applicant: AUO Corporation, Hsin-Chu (TW)

(72) Inventors: Yi-Hsin Lin, Hsin-Chu (TW); Wen-Lung Chen, Hsin-Chu (TW); Yu-Chin Wu, Hsin-Chu (TW); Wei-Lung Liau, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 120 days.

(21) Appl. No.: 18/077,358

(22) Filed: Dec. 8, 2022

(65) Prior Publication Data

US 2023/0174829 A1    Jun. 8, 2023

(30) Foreign Application Priority Data

Dec. 8, 2021   (TW) .................................. 110145774

(51) Int. Cl.
| | |
|---|---|
| *C09J 7/40* | (2018.01) |
| *H01L 25/075* | (2006.01) |
| *H01L 27/15* | (2006.01) |
| *H01L 33/58* | (2010.01) |

(52) U.S. Cl.
CPC .......... *C09J 7/403* (2018.01); *H01L 25/0753* (2013.01); *H01L 27/15* (2013.01); *H01L 33/58* (2013.01); *H01L 2933/0058* (2013.01)

(58) Field of Classification Search
CPC .. C09J 7/403; C09J 2203/318; C09J 2301/18; C09J 7/10; H01L 25/0753; H01L 27/15; H01L 33/58; H01L 2933/0058; H01L 33/56; H01L 33/62; H01L 33/0095; H01L 23/544; H01L 27/156; H01L 2223/54426; G09F 9/33; Y10T 428/14

See application file for complete search history.

(56) References Cited

U.S. PATENT DOCUMENTS

| | | | |
|---|---|---|---|
| 10,571,730 | B2 | 2/2020 | Tang et al. |
| 11,456,259 | B2 | 9/2022 | Sen |
| 11,862,617 | B2 * | 1/2024 | Zhang ............. G09G 3/32 |
| 2024/0105691 | A1 | 3/2024 | Zhang et al. |

FOREIGN PATENT DOCUMENTS

| | | |
|---|---|---|
| CN | 204779455 U | 11/2015 |
| CN | 205603499 U | 9/2016 |
| WO | 2021184261 A | 9/2021 |

OTHER PUBLICATIONS

Office Action issued by the State Intellectual Property Office of The Peoples Republic of China on Apr. 30, 2024 for Application No. 202210347775.0, China.

* cited by examiner

*Primary Examiner* — Patricia L. Nordmeyer
(74) *Attorney, Agent, or Firm* — Tim Tingkang Xia, Esq.; Troutman Pepper Locke

(57) ABSTRACT

An optical adhesive film structure having an alignment function is provided. The optical adhesive film structure includes an optical adhesive layer and a release film. The release film is disposed on the optical adhesive layer. A first film surface of the release film facing away from the optical adhesive layer has a plurality of marks. The marks are recessed into the release film relative to the first film surface and do not run through the release film. A stitching display module and a manufacturing method of the stitching display module are also provided.

4 Claims, 3 Drawing Sheets

OPTICAL ADHESIVE FILM STRUCTURE, STITCHING DISPLAY MODULE AND MANUFACTURING METHOD THEREOF

CROSS-REFERENCE TO RELATED PATENT APPLICATION

This non-provisional application claims priority to and the benefit of, pursuant to U.S.C. § 119 (a), patent application No. 110145774 filed in Taiwan on Dec. 8, 2021. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to an optical adhesive film structure, a stitching display module and a manufacturing method thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the development of the display technology, the demand for the display device is increasing, and the application thereof is more diverse. For example, in a large exhibition hall or a department store, more large-sized display devices are installed to display public information or provide advertisements. To reduce the installation cost and maintenance cost of these large display devices, a stitching display device formed by stitching a plurality of display panels has become one of the common methods for such large display panels. However, stitching a plurality of display panels has the problem of cumulative alignment tolerances. How the cumulative alignment tolerances can be avoided, or even avoiding the cumulative tolerances at a lower manufacturing cost, has become an urgent problem to be solved in manufacturing the stitching display devices.

SUMMARY

The present disclosure provides an optical adhesive film structure, a stitching display module having the optical adhesive film structure, and a manufacturing method of the stitching display module. The optical adhesive film structure has alignment marks, the display panels of the stitching display module does not accumulate alignment tolerances, and the display module can be manufactured at a lower manufacturing cost.

According to one embodiment of the present disclosure, an optical adhesive film structure having an alignment function is provided, including an optical adhesive layer and a release film. The release film is disposed on the optical adhesive layer. A first film surface of the release film facing away from the optical adhesive layer has a plurality of marks, and the marks are recessed into the release film relative to the first film surface and do not run through the release film.

According to another embodiment of the present disclosure, a stitching display module is provided, including the optical adhesive film structure as disclosed above and a plurality of display panels. The display panels are disposed on the optical adhesive layer. The optical adhesive layer is disposed between the display panels and the release film, and the display panels are disposed respectively to correspond to the marks.

According to a further embodiment of the present disclosure, a manufacturing method of a stitching display module is provided, including: disposing an optical adhesive film structure, wherein the optical adhesive film structure has an optical adhesive layer and a release film disposed in a stack; disposing at least one mark on a first film surface of the release film facing away from the optical adhesive layer, wherein the at least one mark are recessed into the release film relative to the first film surface and do not run through the release film; and disposing at least one display panel on the optical adhesive layer, such that the optical adhesive layer is disposed between the at least one display panel and the release film, and the at least one display panel are disposed respectively to correspond to the at least one mark.

Based on the foregoing, the optical adhesive film structure provided in the embodiments of the present disclosure has alignment marks. The display panels of the stitching display module utilizes the alignment marks to perform alignment, thus not accumulate alignment tolerances. In addition, by disposing the alignment marks on the optical adhesive film structure, the display module can be manufactured at a lower manufacturing cost.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The detailed features and advantages of the present disclosure are described below in great detail through the following embodiments, and the content of the detailed description is sufficient for persons skilled in the art to understand the technical content of the present invention and to implement the present invention there accordingly. Based upon the content of the specification, the claims, and the drawings, persons skilled in the art can easily understand the relevant objectives and advantages of the present invention. The following embodiments further describe the viewpoints of the present invention, but are not intended to limit the scope of the present invention in any way.

Referring to FIG. 1A to FIG. 1D, which illustrate schematic views of a manufacturing method of a stitching display module according to an embodiment of the present disclosure.

Figure 1A:
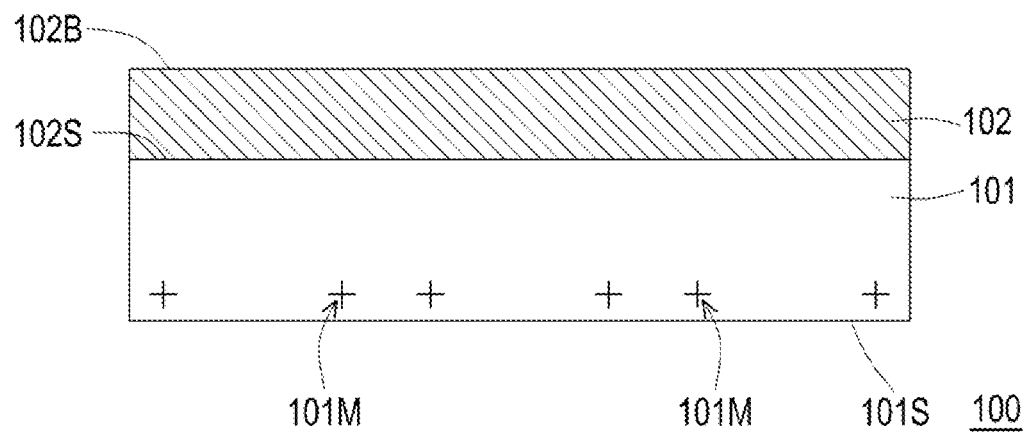
FIG. 1A to FIG. 1D are schematic views of a manufacturing method of a stitching display module according to an embodiment of the present disclosure.

Referring to FIG. 1A, the manufacturing method of the stitching display module includes disposing an optical adhesive film structure 100. The optical adhesive film structure 100 includes a release film 101 and an optical adhesive layer 102. The release film 101 is disposed on the optical adhesive layer 102. A film surface 101S of the release film 101 facing away from the optical adhesive layer 102 has a plurality of marks 101M. The marks 101M are recessed into the release film 101 relative to the film surface 101S and do not run through the release film 101, thus avoiding from damaging the optical adhesive layer 102 and affecting the optical characteristics of the optical adhesive layer 102.

Figure 1B:
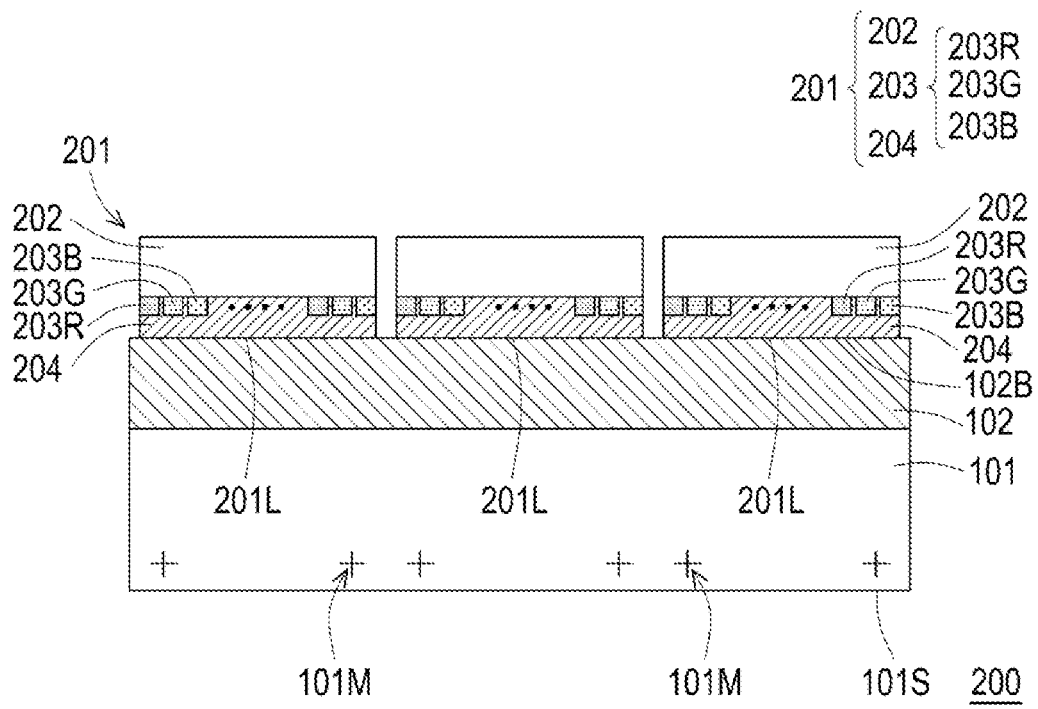

Referring to FIG. 1B, the manufacturing method of the stitching display module further includes disposing a plurality of display panels 201 on the optical adhesive layer 102, thus forming a stitching display module 200. The stitching display module 200 includes the optical adhesive film structure 100 and a plurality of display panels 201. The display panels 201 are disposed on the optical adhesive layer 102. The optical adhesive layer 102 is disposed between the display panels 201 and the release film 101, and the display panels 201 are disposed respectively to correspond to the marks 101M.

In the manufacturing process to dispose the display panels 201 on the optical adhesive layer 102, the marks 101M are used as alignment marks, and each display panel 201 is positioned according to the corresponding mark 101M. Compared to the stitching display module in the related art without disposing the alignment marks, in the stitching display module 200 provided in the present embodiment, each of the display panels 201 is respectively positioned using the corresponding mark 101M, thereby avoiding from accumulating the alignment tolerances.

It should be noted that, although FIG. 1A to FIG. 1D are illustrated as cross-sectional schematic views, in the actual application, the marks 101M are disposed on the film surface 101S in the form of a two-dimensional array, and the display panels 201 are disposed on the optical adhesive layer 102 in the form of a corresponding two-dimensional array.

Specifically, the optical adhesive layer 102 in the present embodiment may be, for example, an optical clear adhesive (OCA). In the related art, the OCA is used to adhere different layers of structures in the display module, and to effectively reduce the reflection of the environment light. The embodiment of the present disclosure utilizes the method of disposing the marks 101M on the release film 101, such that the optical adhesive film structure 100 without removing the release film 101 may provide the alignment function in the subsequent manufacturing process of stitching a plurality of display panels 201, thus increasing the functionalities of the optical adhesive film structure 100 in the manufacturing process. Further, the embodiment of the present disclosure utilize the existing release film 101 in the optical adhesive film structure 100 to dispose the marks 101M, without the need to increase an additional film layer to dispose the marks 101M, and without the need to increase additional cost, thus enhancing the manufacturing accuracy.

Further referring to FIG. 1B, each display panel 201 includes a circuit substrate 202, a plurality of light emitting components 203 and an encapsulating adhesive layer 204. The light emitting components 203 are light emitting diodes (LEDs), and include red LEDs 203R, green LEDs 203G and blue LEDs 203B. The light emitting components 203 are disposed in the form of an array between the circuit substrate 202 and the optical adhesive layer 102. The encapsulating adhesive layer 204 is disposed to cover the light emitting components 203. The encapsulating adhesive layer 204 of each display panel 201 is adhered to the film surface 102B of the optical adhesive layer 102, and a light emitting surface 201L of each of the display panels 201 and the film surface 102B of the optical adhesive layer 102 are coplanar, such that the light emitting surfaces 201L of all of the display panels 201 in the stitching display module 200 are coplanar to one another, thus enhancing the uniformity of the brightness and chromaticity of the stitching display module 200.

Figure 1C:
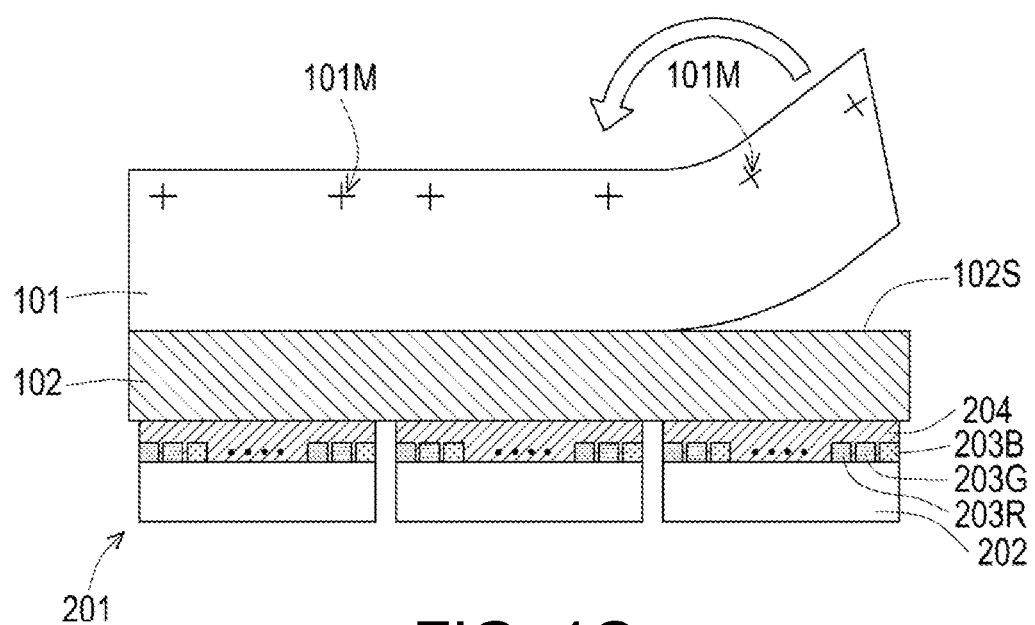
Figure 1D:
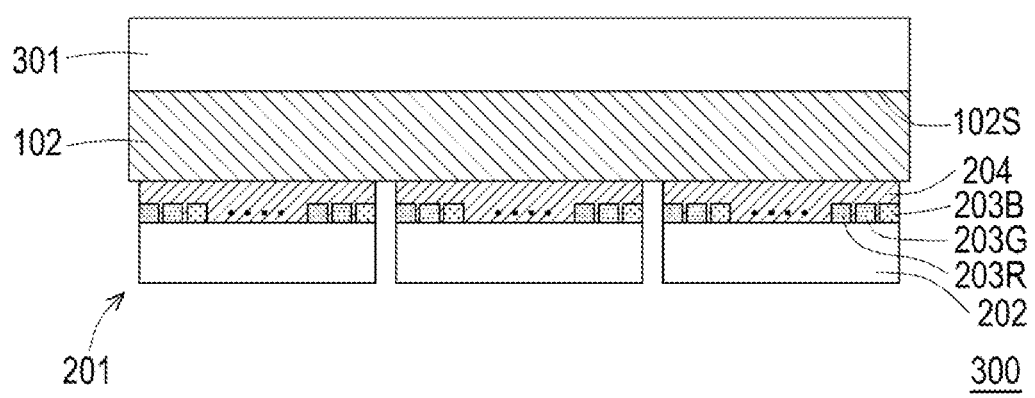

Next, referring to FIG. 1C to FIG. 1D, the manufacturing method of the stitching display module further includes removing the release film 101 from the film surface 102S of the optical adhesive layer 102, and adhering the film surface 102S of the optical adhesive layer 102 to a transparent substrate 301, thus forming the stitching display module 300. The stitching display module 300 includes the transparent substrate 301, a plurality of display panels 201, and the optical adhesive layer 102 disposed between the transparent substrate 301 and the display panels 201 to adhere the transparent substrate 301 and the display panels 201. The transparent substrate 301 may be, for example, a glass substrate, a sapphire substrate, or a flexible substrate including materials such as polyethylene terephthalate (PET) and polyimide (PI).

Figure 2:
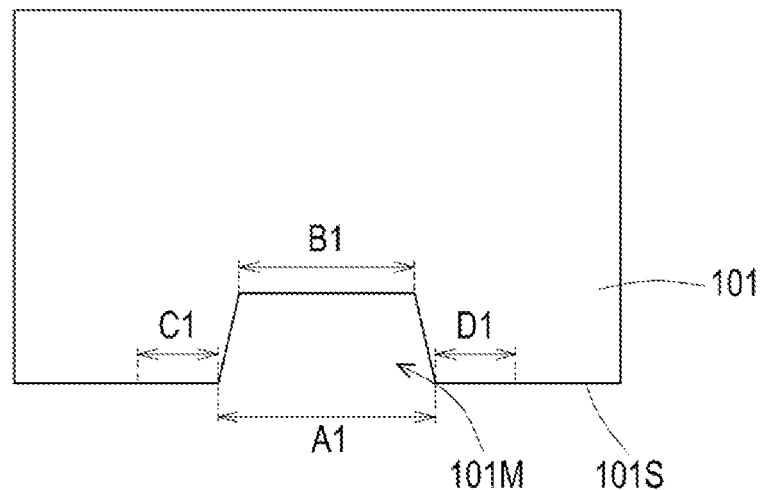
FIG. 2 is a partial cross-sectional view of the release film as shown in FIG. 1A to FIG. 1C.

Referring to FIG. 2, which illustrates a partial cross-sectional view of the release film as shown in FIG. 1A to FIG. 1C. In the present embodiment, the manufacturing method of the stitching display module further includes illuminating the film surface 101S of the release film 101 using a laser to dispose the marks 101M. The marks 101M are recessed into the release film 101 relative to the film surface 101S and do not run through the release film 101. The marks 101M may be any pattern, and has a greater width at a location closer to the film surface 101S. As shown in FIG. 2, the width A1 is greater than the width B1. In addition, the marks 101M further includes a heat-affected region formed by the heat of the laser. The heat-affected region is a preset structure, which is affected by the heat and may possibly have scenarios such as a damaged surface structure or disintegration or modification inside the film layer. The widths C1 and D1 of the heat-affected region may be substantially identical.

To fully describe the embodiments and aspects of the present disclosure, other embodiments of the present disclosure are described as follows. It should be noted that, the embodiment as described will use the reference numbers and certain contents of the embodiment as described above, and the same reference numbers are used to indicate identical or similar components, and the description of identical technical contents are omitted. The descriptions of the omitted portions may be referenced in the embodiment as described above, and thus are not hereinafter elaborated in the embodiment described as follows.

Figure 3:
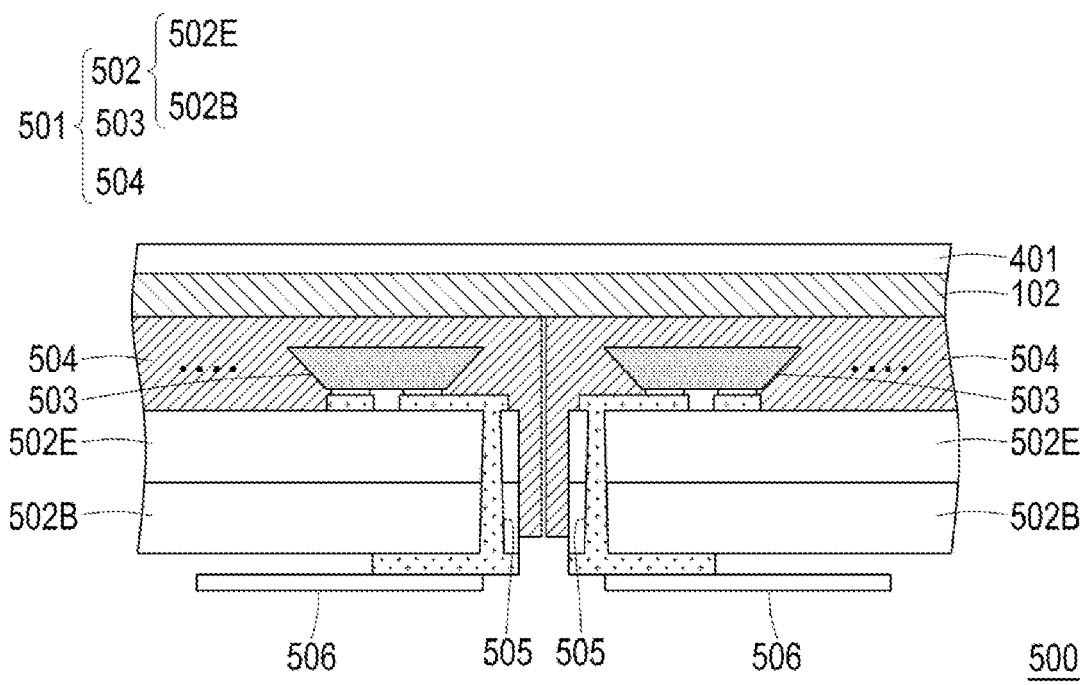
FIG. 3 is a cross-sectional schematic view of a stitching display module according to an embodiment of the present disclosure.

Referring to FIG. 3, which illustrates a cross-sectional schematic view of a stitching display module according to an embodiment of the present disclosure. The stitching display module 500 includes a substrate layer 401, an optical adhesive layer 102 and a plurality of display panels 501. The substrate layer 401 may be the release film 101 in FIG. 1B or the transparent substrate 301 in FIG. 1D. Each display panel 501 includes a circuit substrate 502, a plurality of light emitting components 503 (and for convenience of understanding, FIG. 3 only illustrates one light emitting component 503), and an encapsulating adhesive layer 504.

The circuit substrate 502 includes a supporting plate 502B and a circuit layer 502E. The supporting plate 502B is flexible, and may include materials such as PET or PI. The light emitting components 503 are disposed on the surface of the circuit substrate 502 facing the optical adhesive layer 102. The display panel 501 utilizes the chip on film (COF) technology to integrate the driving chips of the display panel 501 on the flexible circuit board 506. The through hole 505 runs through the circuit substrate 502, and a conductive metal is disposed in the through hole 505, such that each of the light emitting components 503 are electrically connected to the flexible circuit board 506 through the conductive metal in the through hole 505.

In sum, the the optical adhesive film structure provided in the embodiments of the present disclosure has alignment marks. The display panels of the stitching display module utilizes the alignment marks to perform alignment, thus not accumulate alignment tolerances. In addition, by disposing the alignment marks on the existing release film of the optical adhesive film structure, the display module can be manufactured at a lower manufacturing cost.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A stitching display module, comprising:
an optical adhesive film structure having an alignment function, the optical adhesive film structure comprising:
an optical adhesive layer; and
a release film, disposed on the optical adhesive layer, wherein a first film surface of the release film facing away from the optical adhesive layer has a plurality of marks, and the marks are recessed into the release film relative to the first film surface and do not run through the release film; and
a plurality of display panels, disposed on the optical adhesive layer;
wherein the marks are disposed in a form of a two-dimensional array, and the display panels are disposed in a form of a corresponding two-dimensional array;
wherein the optical adhesive layer is disposed between the display panels and the release film, and the display panels are disposed respectively to correspond to the marks.

2. The stitching display module according to claim 1, wherein each of the display panels comprises a circuit substrate and a plurality of light emitting components, and the light emitting components are disposed between the circuit substrate and the optical adhesive layer.

3. The stitching display module according to claim 2, wherein each of the display panels further comprises an encapsulating adhesive layer disposed to cover the light emitting components, and the encapsulating adhesive layer is disposed between the light emitting components and the optical adhesive layer.

4. The stitching display module according to claim 1, wherein a light emitting surface of each of the display panels and a second film surface of the optical adhesive layer facing away from the release film are coplanar.

* * * * *